United States Patent [19]

Etemadpour et al.

[11] Patent Number: 5,646,522
[45] Date of Patent: Jul. 8, 1997

[54] WIRELESS TEST FIXTURE FOR HIGH FREQUENCY TESTING

[75] Inventors: Alan Etemadpour, Van Nuys; Gary R. Haugh, Yorba Linda; Charles J. Lotka, Burbank; Stephen Pizzica, San Pedro, all of Calif.

[73] Assignee: Hughes Electronics, Los Angeles, Calif.

[21] Appl. No.: 755,756

[22] Filed: Jun. 19, 1996

Related U.S. Application Data

[63] Continuation of Ser. No. 951,502, Sep. 24, 1992, abandoned.
[51] Int. Cl.$^6$ ........................... G01R 1/04; G01R 31/28
[52] U.S. Cl. ............... 324/158.1; 324/754; 439/66
[58] Field of Search ..................... 324/158.1, 754, 324/73.1, 258; 439/66; 339/117, 255.1

[56] References Cited

U.S. PATENT DOCUMENTS

| | | | |
|---|---|---|---|
| 4,573,756 | 3/1986 | Smith et al. | 339/117 |
| 4,724,377 | 2/1988 | Maelzer et al. | 324/754 |
| 4,922,191 | 5/1990 | Conover | 324/158.1 |
| 5,434,513 | 7/1995 | Fujii et al. | 324/754 |
| 5,493,237 | 2/1996 | Voltz et al. | 324/754 |

*Primary Examiner*—Kenneth A. Wieder
*Assistant Examiner*—Barry C. Bowser
*Attorney, Agent, or Firm*—Leonard A. Alkov; Wanda K. Denson-Low

[57] ABSTRACT

The wireless test fixture (50) for high frequency testing incorporates a printed wiring board (52) which directly interconnects the connector (55) into which a module (66) to be tested is inserted and the circuitry from a test machine (10) to minimize path lengths, minimize coupling between conductors, eliminate random coupling between wires and bundles, and eliminate most wiring.

12 Claims, 2 Drawing Sheets

WIRELESS TEST FIXTURE FOR HIGH FREQUENCY TESTING

This is a continuation of application Ser. No. 07/951,502, filed Sep. 24, 1992, now abandoned.

GOVERNMENT RIGHTS

This invention was made with Government support under Contract N00019-89-C-0130 awarded by the Department of the Navy. The Government has certain rights in this invention.

FIELD OF THE INVENTION

This invention is directed to the field of testing electronic modules, and particularly to the interconnection of an electronic test machine to a module to be tested.

BACKGROUND OF THE INVENTION

Testing machines are program-controlled to provide a series of output signals in various lines to energize a module to be tested. The module has outputs which are received by the machine and compared to what is expected from a properly operating module. A test fixture is supplied to connect to the input and output contacts on the test machine and organize their positioning for connecting to the input and output contacts on the module. This can be accomplished by wire-wrapping a breadboard, but such structure does not permit operation at high frequency. When handwired, each test fixture configuration requires a special noise and crosstalk suppression circuit just to get it operating, depending on how it was wire-wrapped. The higher the frequency of the test signal, the more complex becomes the tuning circuit. The tuning circuit often consisted of extra filter capacitors and special termination circuitry which in itself affected the test being done. In some cases, rerouting of a wire was necessary in order to avoid undesired coupling. Thus, prior test fixtures each had their own individual character so that repeatability between test fixtures was difficult to achieve.

SUMMARY OF THE INVENTION

In order to aid in the understanding of this invention, it can be stated in essentially summary form that it is directed to a wireless test fixture for high frequency testing wherein a printed wiring board has on its lower side pads for connection to a test machine and has on its upper side a connector for receiving the module to be tested. The printed wiring board has suitable printed wiring thereon for the proper connection between the pads and the connector.

It is thus a purpose and advantage of this invention to provide a wireless test fixture for high frequency testing which employs a printed wiring board to achieve the connections between the pads and the connector so that the problems of wire wrapping and circuit noise and crosstalk are avoided.

It is another object and advantage of this invention to provide a wireless test fixture which incorporates a printed wiring board to connect pads on the lower side of the printed wiring board to a connector connected to the printed wiring board so that repeatability of the connections is achieved allowing a plurality of similar test fixtures to be manufactured without the need for noise and crosstalk debugging of each test fixture.

Other purposes and advantages of this invention will become apparent from a study of the following portion of this specification, the claims and the attached drawings wherein:

DESCRIPTION OF THE PREFERRED EMBODIMENT

Figure 1:
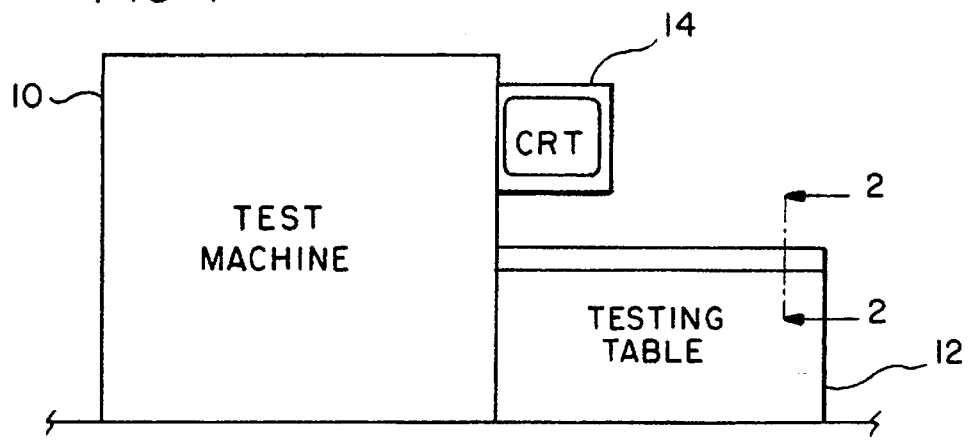
FIG. 1 is a front view of a test machine which utilizes the wireless test fixture of this invention.
Figure 2:
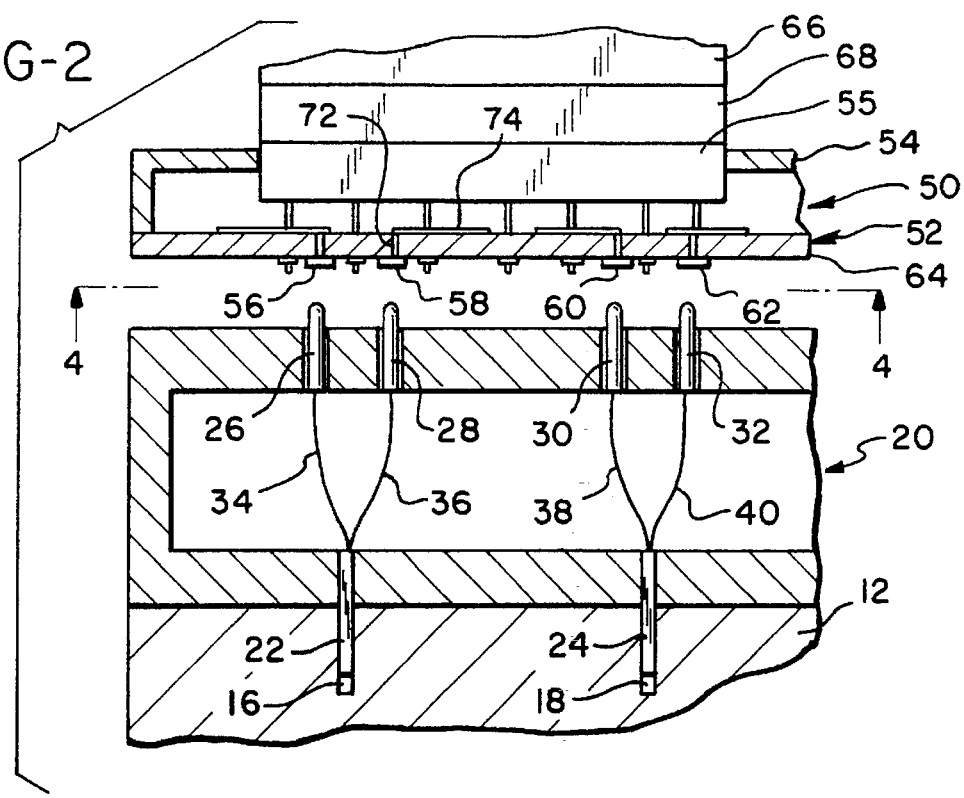
FIG. 2 is an enlarged section taken generally along line 2—2 of FIG. 1.

The wireless test fixture of this invention is used with a machine 10 which is especially designed for testing electronic modules. The test machine includes a test table 12 which is at a convenient height for access. An output device 14 informs the test personnel on the status of the module being tested. The output device 14 may be a visual device such as a CRT or may be a hard copy output such as a printer, or both. As seen in FIG. 2, the test table 2 has a plurality of slots therein. Slots 16 and 18 are specifically identified, and it is expected that there may be more such slots. The slots contain contacts therein which would match the contacts on the edges of printed wiring boards. The test machine 10 has an output which applies signals to various ones of these contacts in various combinations so that a module connected thereto would have a particular output which, in turn, would be sensed in the test machine and displayed on the output device 14. The contacts in the slot 16 are in a fixed relationship and do not necessarily match the positioning of contacts on a module to be tested.

Figure 3:
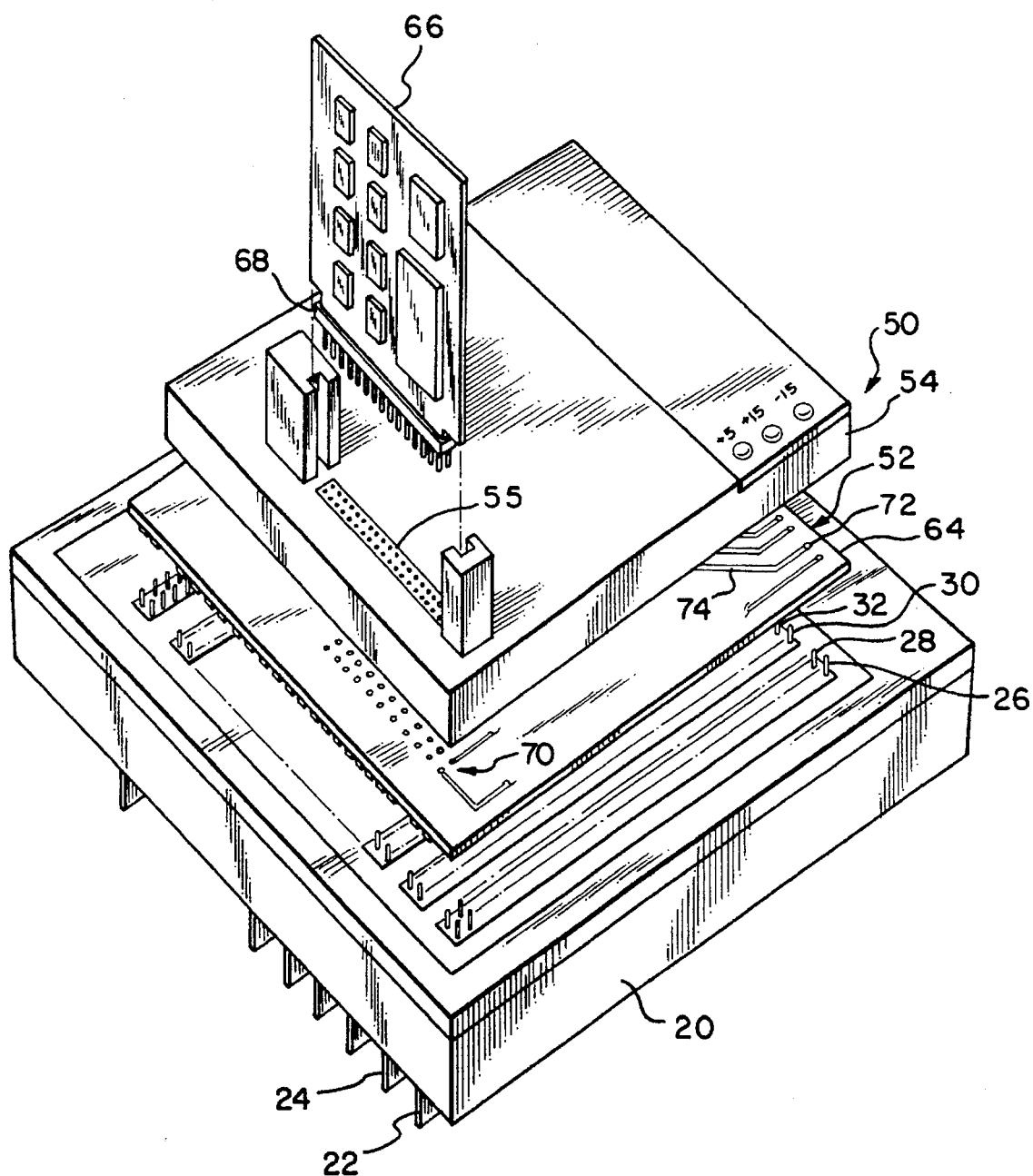
FIG. 3 is an exploded isometric view showing the base separated from the test table and the test fixture of this invention opened.

Base 20 is shown as having a plurality of connector webs, including webs 22 and 24, which are seen in FIG. 2. The webs 22 and 24 respectively enter into slots 16 and 18. The balance of the webs shown in FIG. 3 also enter into similar slots in the test table. The webs are made of insulator material and have a contact on each side thereof for respective engagement with corresponding contacts in the slots. There is a line of contacts in each slot on each side thereof, each connected to the circuitry in the test machine. The webs have contacts on each side thereof for engagement therewith. Looking from the right end of FIG. 3, the first pin of each row of the contact pins is shown. Pins 26, 28, 30 and 32 are shown in FIGS. 2 and 3. Each pin corresponds to a contact on a web and contact in a slot. Pins 26 and 28 are respectively connected by wires 34 and 36 to contacts on opposite sides of web 22. Similarly, pins 30 and 32 are respectively connected by wires 38 and 40 to contacts on opposite sides of web 28. The pins are spring-mounted in the top of base 20 to aid in maintaining contact to circuits thereabove.

Figure 4:
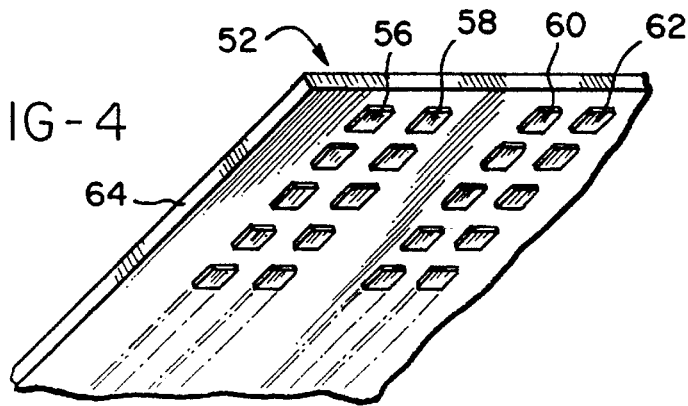
FIG. 4 is an isometric bottom view of the printed wiring board in the test fixture of this invention, as seen generally along line 4—4 of FIG. 2.

The test fixture 50 of this invention includes a printed wiring board 52, a cover 54 and a connector 56. The printed wiring board has on its lower side a series of pads which correspond in position to the spring contact pins in the upper side of base 20. Pads 56, 58, 60 and 62 are shown in FIG. 4 as being on the underside of the insulative printed wiring board substrate 64. As seen in FIG. 4, these pads represent the first pads in the long row of pads corresponding to the spring pin contacts.

Module 66 is the electronic device to be tested and illustrates one such device. The module 66 may be of a number of different configurations, but in each configuration carries thereon semiconductor devices and printed wiring to form one or more sub-circuits thereon. The module is connected into its mother board by means of a male connector 68. The male connector 68 has male pins thereon which are necessarily arranged in a suitable way to connect the circuits on the module to the circuits on its normal mother board.

The female connector 55 on the fixture 50 receives the male connector 68 to make connections. The female connector 55 has a pin extending out of the back corresponding to each contact socket in the female connector. The pins on the back of the female connector extend through corresponding openings in the printed wiring board 52. These openings are generally indicated at 70 in FIG. 3. The pins on the back of the female connector extend through the printed wiring board 52 and are soldered on the lower side, as by wave soldering. Some of the pins are shown extending through the printed wiring board in FIG. 2. The openings 70 may be vias, which means that they are electrical connectors between layers of printed wiring in the printed wiring board. When they are vias, they are connected to both a connector pin extending out of the back of the female connector and to printed wiring on the board.

The printed wiring board connects appropriate of the openings 70 to appropriate ones of the pads on the underside of the substrate 64. This is accomplished by conventional printed wiring techniques, including vias, which are shown in FIG. 2. One via 72 is shown as extending through the substrate 64 upward from pad 58 to printed wiring 74 on the top side of the substrate 64. The vias and printed wiring are appropriately positioned and connected to provide the desired circuitry between the pads on the underside of the printed wiring board and the female contacts within the female connector 55. In this way, a module 66 can be inserted and tested, as shown in FIGS. 2 and 3. The use of a printed wiring board 52 in the test fixture is desirable because wire wrapping is eliminated and the test fixture can be run at a higher frequency. Timing failures in the module can be detected to improve test yield. For each module, a different test fixture is usually required. However, with the use of a printed wiring board in the test fixture, the different circuitry can be quickly and accurately created.

This invention has been described in its presently contemplated best modes, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A test system including a base for attachment to a test machine which provides electrical output signals, the base having an upper surface and having a plurality of spring contacts on the upper surface, the improvement comprising:

a test fixture including a printed wiring board, said printed wiring board having a lower surface, a plurality of contact pads on said lower surface corresponding to said spring contacts on said base, said test fixture having a connector thereon, said connector on said test fixture corresponding to the connector on an electronic module to be tested, a plurality of printed wiring traces on said printed wiring board interconnecting said pads with said connector on said printed wiring board, wherein said connector on said printed wiring board has pins thereon, wherein said pins extend through said printed wiring board and are soldered to said printed wiring board on the lower surface thereof, and said pins engage said printed wiring board for connection to printed wiring thereon; and an output device to inform test personnel on status of the printed wiring board being tested, wherein said contact pads receive said electrical output signals in predetermined combinations from said test machine, so that a module has a particular output signal sensed in said test machine and displayed on said output device.

2. The test system of claim 1 wherein said spring contacts on said base are spring pins mounted on said base to resiliently move longitudinally of the length of the pins as said test fixture is placed on said base.

3. The test system of claim 1 wherein said connector on said test fixture is a female connector for association with and receipt of a male connector on an electronic module to be tested.

4. The test system of claim 3 wherein said spring contacts on said base are spring pins mounted on said base to resiliently move longitudinally of the length of the pins as said test fixture is placed on said base.

5. A test fixture comprising:

a printed wiring board having an upper surface and a lower surface, a plurality of pads on said lower surface arranged to be contacted to receive and deliver signals relating to the electronic testing of an electronic module;

a female connector forming a portion of said test fixture, said female connector having pins thereon, said pins extending at least to said printed wiring board and being electrically connected to said printed wiring board; and printed wiring on said printed wiring board, including vias through said printed wiring board inter-connecting selected pads with selected connector pins wherein the vias and printed wiring are positioned and connected to provide desired circuitry between the pads on the lower surface of the printed wiring board and the female contacts within the female connector, so that when an electronic module having a mating connector thereon is mounted in said connector on said test fixture, wherein said pads, said printed wiring and said connector mounted on said printed wiring board transfer appropriate electronic signals in predetermined combinations from the test machine to the electronic module under test, so that said electronic module has a particular output signal sensed in the test machine and displayed on an output device.

6. The test fixture of claim 5 wherein said connector is a female connector and said pins on said female connector extend at least partway through said printed wiring board.

7. The test fixture of claim 6 wherein said pins on said female connector extend all the way through said printed wiring board and are soldered to printed wiring on said printed wiring board on the same side as said pads.

8. The test fixture claim 7 further including in combination therewith a base, said base having a lower side configured to connected to the test table of a test machine and said base having an upper side including spring contacts which connect to said pads on said lower side of said printed wiring board.

9. The test fixture of claim 8 wherein said spring contacts are spring pins which move substantially at right angles to said base.

10. A test system comprising:

a base, said base having a lower surface and having a plurality of webs, which have contacts on each side thereof, made of insulating material extending below said lower surface for engagement in slots in a test machine, said webs having contacts thereon, said base having an upper surface, a plurality of spring pins extended from said upper surface of said base, said spring pins being arranged in two rows corresponding to each web, said contacts on each said web being directly connected to said spring pins corresponding to said web so that electrical connections are brought up from said test machine to said spring pins;

a test fixture, said test fixture including a printed wiring board having a lower surface, said lower surface of said printed wiring board having contact pads thereon, said contact pads being positioned to engage said spring pins, a female connector mounted on said printed wiring board, said female connector having contact pins extending therefrom and extending to said printed wiring board, said printed wiring board having connections thereon for connection to said connector pins, printed wiring on said printed wiring board, said printed wiring interconnecting selected ones of said pads to selected ones of said connector pins so that when an electronic module having a corresponding connector is mounted in said female connector, selected electronic signals in predetermined combinations pass from the test machine to the module and back from the module to the test machine, so that a module has a particular output signal sensed in the test machine through said printed wiring on said printed wiring board; and an output device to inform test personnel on status of the printed wiring board being tested.

11. The test system of claim 10 wherein said pins extend through said printed wiring board and are soldered to printed wiring on said printed wiring board on the lower face of said printed wiring board carrying said pads.

12. The test system of claim 11 further including guides on said test fixture adjacent said female connector on said test fixture to guide a module to be tested to said connector on said printed wiring board to aid in positioning and retaining an electronic module to be tested.

* * * * *